United States Patent [19]
Eto

[11] Patent Number: 5,869,984
[45] Date of Patent: Feb. 9, 1999

[54] OUTPUT BUFFER CIRCUIT UTILIZING FETS FOR LOWERING OUTPUT RESISTANCE OF A CIRCUIT BLOCK

[75] Inventor: Satoshi Eto, Kawasaki, Japan

[73] Assignee: Fujitsu Limited, Kawasaki, Japan

[21] Appl. No.: 673,475

[22] Filed: Jul. 1, 1996

Related U.S. Application Data

[63] Continuation of Ser. No. 345,757, Nov. 22, 1994, abandoned.

[30] Foreign Application Priority Data

Jan. 13, 1994 [JP] Japan ................................. 6-002064

[51] Int. Cl.$^6$ ................. H03K 19/0185; H03K 19/0948
[52] U.S. Cl. .................................. 326/86; 326/17; 326/30
[58] Field of Search .................................. 326/83, 86, 17, 326/30, 57–58, 80–81, 119, 121, 114, 87, 88

[56] References Cited

U.S. PATENT DOCUMENTS

| | | | |
|---|---|---|---|
| 4,877,978 | 10/1989 | Platt | 326/58 |
| 5,066,873 | 11/1991 | Chan et al. | 326/86 |
| 5,087,840 | 2/1992 | Davies et al. | 326/58 |
| 5,128,560 | 7/1992 | Chern et al. | 326/83 |
| 5,153,450 | 10/1992 | Ruetz | 326/87 |
| 5,153,455 | 10/1992 | Walters, Jr. | 326/114 |
| 5,206,544 | 4/1993 | Chen et al. | 326/86 |
| 5,387,824 | 2/1995 | Michelsen | 325/86 |

FOREIGN PATENT DOCUMENTS

| | | |
|---|---|---|
| 2-62111 (A) | 3/1990 | Japan . |
| 5-243939 (A) | 9/1993 | Japan . |

*Primary Examiner*—Jon Santamauro
*Attorney, Agent, or Firm*—Nikaido, Marmelstein, Murray & Oram LLP

[57] ABSTRACT

An output buffer circuit includes a portion for receiving an input signal in which a level thereof is changed from a high level to a low level and vice versa, and a circuit block for operating based on the input signal received by the portion and for outputting an output signal in which a level thereof is changed from a high level to a low level and vice versa in response to level transition of the input signal, the circuit block including a circuit arrangement of a plurality of FETs for temporarily lowering an output resistance of the circuit block in level transition of the output signal.

7 Claims, 11 Drawing Sheets

OUTPUT BUFFER CIRCUIT UTILIZING FETS FOR LOWERING OUTPUT RESISTANCE OF A CIRCUIT BLOCK

This application is a continuation of application Ser. No. 08/345,757 filed Nov. 22, 1994, now abandoned.

BACKGROUND OF THE INVENTION (1) Field of the Invention

The present invention generally relates to an output buffer circuit and more particularly to an output buffer circuit capable of stably outputting, to a transmission line, a signal in which a high level is changed to a low level and vice versa at a high speed.

Small-amplitude interfaces, such as the so called CTT (Center Tap Terminal) and T-LVTTL(Terminated LVTTL), are used as high-speed I/O interfaces for CMOS devices. In such interfaces, high-speed input/output operations between a CPU (Central Processing Unit) and memories are required, so that impedance matching between the CPU side devices and the memory side devices are needed to process signals at a high speed.

(2) Description of the Related Art

FIG. 1 shows a conventional output buffer circuit which is used in the small-amplitude interface such as the CTT.

Referring to FIG. 1, a device 210, such as a CPU or a memory device, includes an output buffer circuit 211. The output buffer circuit 211 has a p-type FET 215 (MOSFET) and an n-type FET 216 (MOSFET). The source (S) of the p-type FET 215 is connected to a power line $V_{cc}$. The source (S) of the n-type FET 216 is connected to a ground line $V_{ss}$. The gates (G) of the p-type FET 215 and the n-type FET 216 are connected to each other, and the drains (D) thereof are connected to each other. Signals are input to the gates (G) of the p-type FET 215 and the n-type FET 216. Signals from the drains (D) of the p-type FET 215 and the n-type FET 216 are supplied, as output signals of the output buffer circuit 211, to a bus line 225 (a signal transmission line) which is terminated by a terminating resistor $R_t$ 226 connected to a power line $V_{tt}$. The voltage of the power line $V_{tt}$ is approximately half of that of the power line $V_{cc}$ ($V_{tt}=\frac{1}{2}V_{cc}$). Devices 222, 223 and 224, such as memories, are connected to the bus line 225.

The above circuit including the conventional output buffer circuit 211 is operated as follows.

In a case where the device 210 should output a signal having a high level (referred to as an H-level signal), a signal having a low level (referred to as an L-level signal) is input to the gates of the p-type FET 215 and the n-type FET 216. In this case, the p-type FET 215 is in an ON state and the n-type FET 216 is in an OFF state. As a result, the H-level signal is output from the output buffer circuit 211. At this time, a current flows from the power line $V_{cc}$ to the power line $V_{tt}$ through the source (S) of the p-type FET 215, the drain (D) of the p-type FET 215, the bus line 225 and the terminating resistor $R_t$ 226.

In a case where the device 210 should output an L-level signal, an H-level signal is input to the gates of the p-type FET 215 and the n-type FET 216. In this case, the p-type FET 215 is in the OFF state and the n-type FET 216 is in the ON state. As a result, the L-level signal is output from the output buffer circuit 211. At this time, a current flows from the power line $V_{tt}$ to the ground line $V_{ss}$ through the terminating register $R_t$ 226, the drain (D) of the n-type FET 216 and the source (S) of the n-type FET 216.

In the conventional output buffer circuit 211 as described above, there is a relationship, as shown in FIG. 2(a), between the input signal (IN) and the output signal (OUT). A node at which the drains (D) of the p-type FET 215 and the n-type FET 216 are connected is an output terminal of the output buffer circuit 211. Thus, even if the input signal (IN) varies as shown in FIG. 2(a), a voltage $V_{gs}$ between the gate (G) and the source (S) of each of the FETS 215 and 216 is maintained at a constant level. As a result, the output resistance $R_{out}$ of the output buffer circuit 211 is constant as shown in FIG. 2(b). The output resistance $R_{out}$ is designed so that the level of the output signal (OUT) responsive to the input signal (IN) as shown in FIG. 2(a) satisfies conditions of the small-amplitude interface such as the CTT. In this case, the output resistance $R_{out}$ (e.g. 70Ω) is generally greater than an impedance (e.g. 30Ω) of the bus line 225 (referred to as a line impedance Z) as shown in FIG. 2(b).

In addition, various devices such as the memories may be connected to the bus line 225. In this case, due to the impedances of the devices connected to the bus line 225, the line impedance Z is further lowered. Furthermore, for example, SIMMs (Single In-line Memory Modules) each of which is a printed circuit board provided with DRAMs may be detachably connected to the bus line 225. That is, the number of SIMMs may be varied, so that the line impedance Z may be varied.

As has been described above, the output resistance $R_{out}$ of the output buffer circuit 211 is higher than the line impedance Z which may be varied in accordance with the number of devices connected to the line to which signals are output from the output buffer circuit 211. Thus, it is difficult to make the matching between the output resistance $R_{out}$ and the line impedance Z.

In a case where the matching between the output resistance $R_{out}$ of the output buffer circuit 211 and the line impedance Z are not made, the waveform of the output signal is distorted in the level transition (the high level to the low level and vice versa) of the output signal. The waveform distortion of the output signal results from signal reflection at the terminating resistor and the devices connected to the line.

In a case where the frequency of the output signal from the output buffer circuit 211 is relatively low, the waveform distortion of the output signal in the level transition is inconspicuous. However, in a case where the frequency of the output signal from the output buffer circuit is relatively high, the waveform distortion of the output signal is conspicuous. Thus, it is difficult to stably transmit a signal output from the conventional output buffer circuit through the transmission line at a high speed.

SUMMARY OF THE INVENTION

Accordingly, a general object of the present invention is to provide a novel and useful output buffer circuit in which the disadvantages of the aforementioned prior art are eliminated.

A more specific object of the present invention is to provide an output buffer circuit capable of stably outputting, to a transmission line having a line impedance, a signal in which the level transition from the high level to the low level and vice versa is performed at a high speed.

The above objects of the present invention are achieved by an output buffer circuit comprising: a portion for receiving an input signal in which a level thereof is changed from a high level to a low level and vice versa; and a circuit block, coupled to the portion, for operating based on the input signal received by the portion and for outputting an output signal in which a level thereof is changed from a high level to a low level and vice versa in response to level transition of the input signal, the circuit block including a circuit arrangement of a plurality of FETs for temporarily lowering an output resistance of the circuit block in level transition of the output signal.

According to the present invention, since the output resistance of the circuit block is temporarily lowered in the level transition of the output signal, the output resistance can be temporarily close to a line impedance of the transmission line in the level transition of the output signal. Thus, the waveform distortion of the output signal in the level transition thereof can be improved, so that the output signal can be stably output to the transmission line.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

A description will be given, with reference to FIGS. 3 through 6, of the principle of an output buffer circuit according to an embodiment of the present invention.

Figure 1:
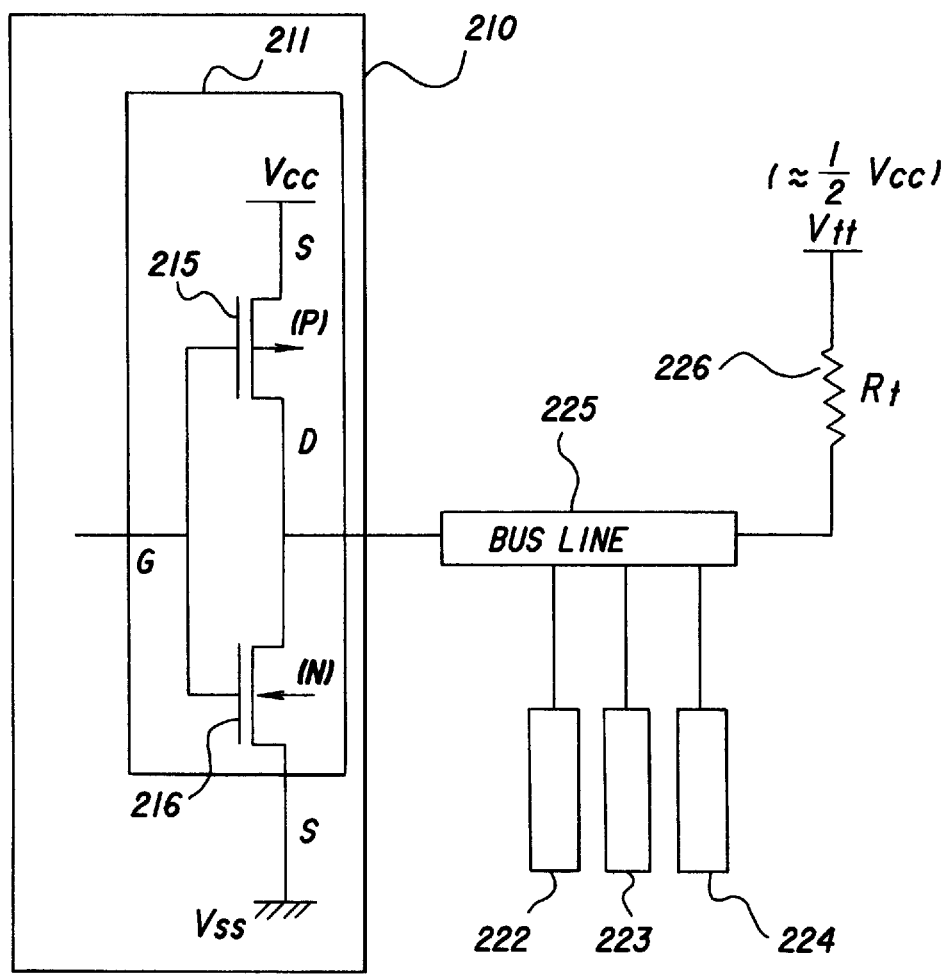
FIG. 1 is a circuit diagram illustrating a circuit including a conventional output buffer circuit.
Figure 2:
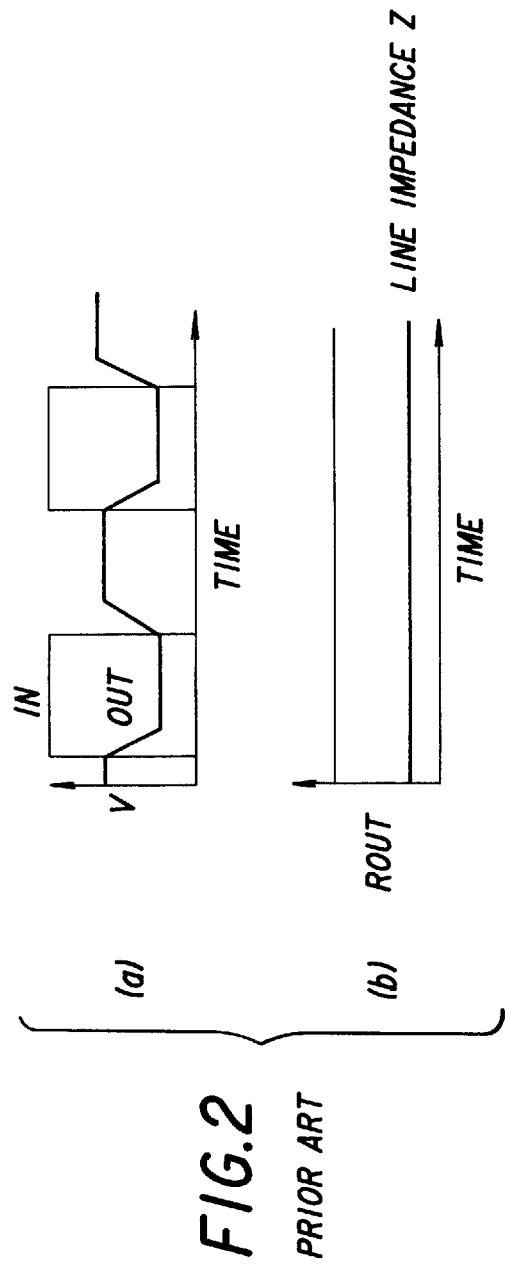
FIGS. 2(a) and (b) is a diagram illustrating an input signal (IN), an output signal (OUT) and an output resistance $R_{out}$ in a case of the conventional output buffer circuit.
Figure 3:
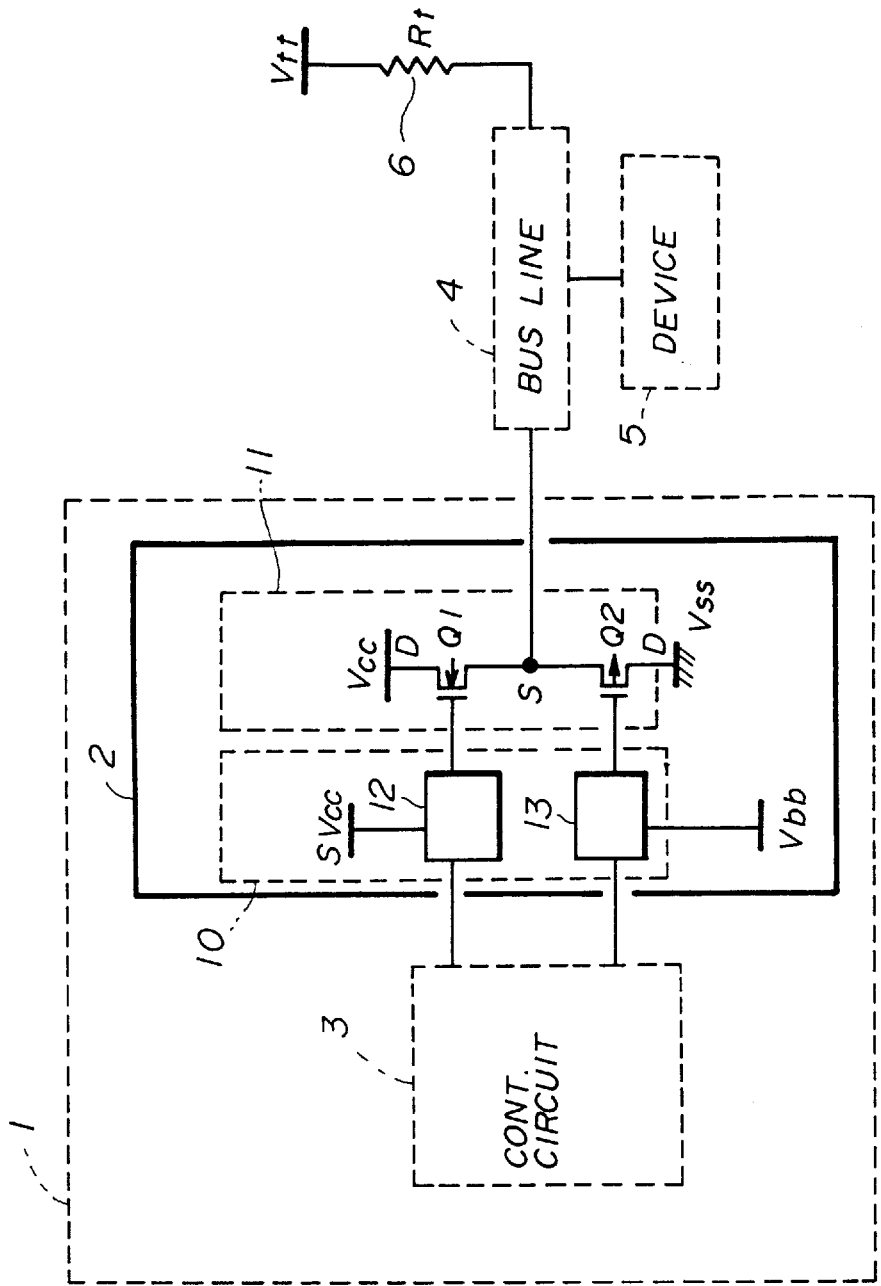
FIG. 3 is a circuit diagram illustrating the principle of an output buffer circuit according to an embodiment of the present invention.

Referring to FIG. 3, showing an essential structure of a circuit including an output buffer circuit, a device 1, such as a CPU or a memory device, has an output buffer circuit 2 and a control circuit 3. The output buffer circuit 2 has a driver circuit 10 and an output circuit 11. The output circuit 11 includes an n-type FET Q1 (MOSFET) and a p-type FET Q2 (MOSFET). The drain (D) of the n-type FET Q1 is connected to a power line Vcc, and the drain (D) of the p-type FET Q2 is connected to a ground line $V_{ss}$. The sources (S) of both the n-type FET Q1 and the p-type FET Q2 are connected to each other.

The driver circuit 10 has a first driver unit 12 and a second driver unit 13. The first driver unit 12 is connected to a power line $SV_{cc}$ having a voltage greater than that of the power line $V_{cc}$. The first driver unit 12 supplies a first driving signal to the gate (G) of the n-type FET Q1. The level of the first driving signal is changed from a high level to a low level and vice versa in accordance with a first control signal from the control circuit 3. The high level of the first driving signal corresponds to the voltage of the power line $SV_{cc}$ and is higher than the voltage of the power line $V_{cc}$. The second driver unit 13 is connected to a power line $V_{bb}$ having a voltage less than that of the ground line $V_{ss}$. The second driver unit 13 supplies a second driving signal to the gate (G) of the p-type FET Q2. The level of the second driving signal is changed from a high level to a low level and vice versa in accordance with a second control signal from the control circuit 3. The low level of the second driving signal corresponds to the voltage of the power line $V_{bb}$ and is lower than the voltage of the ground line $V_{ss}$.

The node at which the sources (S) of the n-type FET Q1 and the p-type FET Q2 are connected is, as an output terminal, connected to a bus line 4 which is terminated by a terminating resistor $R_t$ 6 connected to a power line $V_{tt}$. The voltage of the power line $V_{tt}$ is approximately half of that of the power line $V_{cc}$ ($V_{tt}=\frac{1}{2}V_{cc}$). A device 5, such as another memory device or another CPU, is connected to the bus line 4.

The circuit shown in FIG. 3 is operated as follows.

In a first case where the first driving signal having the high level (corresponding to the voltage of the power line $SV_{cc}$) is supplied to the gate (G) of the n-type FET Q1 and the second driving signal having the high level (H-level) is supplied to the gate (G) of the p-type FET Q2, the n-type FET Q1 is in an ON state and the p-type FET Q2 is in an OFF state. A current thus flows from the power line $V_{cc}$ through the drain (D) of the n-type FET Q1, the source (S) of the n-type FET Q1, the bus line 4 and the terminating resistor $R_t$ 6 to the power line $V_{tt}$. As a result, the H-level signal is output from the output buffer circuit 2 to the bus line 4.

In the first case, the n-type FET Q1 is in source follower operation.

On the other hand, in a second case where the first driving signal having the low level (L-level) is supplied to the gate (G) of the n-type FET Q1 and the second driving signal having the low level (corresponding to the voltage of the power line $V_{bb}$) is supplied to the gate (G) of the p-type FET Q2, the n-type FET Q1 is in the OFF state and the p-type FET Q2 is in the ON state. A current thus flows from the power line $V_{tt}$ through the terminating resistor $R_t$ 6, the bus line 4, the source (S) of the p-type FET Q2 and the drain (D) of the p-type FET Q2 to the ground line $V_{ss}$. As a result, the L-level signal is output from the output buffer circuit 2 to the bus line 4.

In the second case, the p-type FET Q2 is in source follower operation.

Figure 4A:
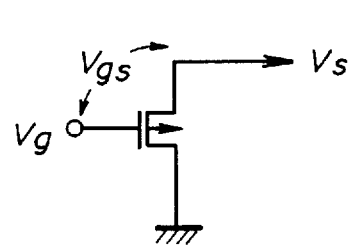
FIG. 4A is a diagram illustrating a p-type FET used in the buffer circuit according to an embodiment of the present invention.

In the source follower operation of the p-type FET shown in FIG. 4A (corresponding to the above second case), the gate voltage $V_g$ and the source voltage $V_s$ are varied, as shown in FIG. 5(a), in the level transition from the high level to the low level. Thus, the absolute value of the gate-source voltage $V_{gs}$ which is the difference between the gate voltage $V_g$ and the source voltage $V_s$ is varied as shown in FIG. 5(c). That is, the gate-source voltage $|V_{gs}|$ is gradually lowered in the level transition of the gate voltage $V_g$. Since a reciprocal of the output resistance $R_{out}$ is in proportion to the gate-source voltage $|V_{gs}|$, the output resistance $R_{out}$ is varied as shown in FIG. 5(d). That is, the output resistance $R_{out}$ is rapidly decreased at a level transition time $t_r$ and is then gradually increased to a constant value.

Figure 4B:
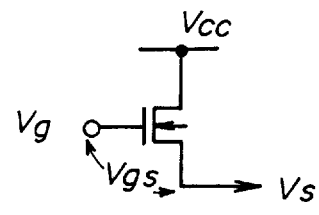
FIG. 4B is a diagram illustrating an n-type FET used in the buffer circuit according to the embodiment of the present invention.
Figure 5:
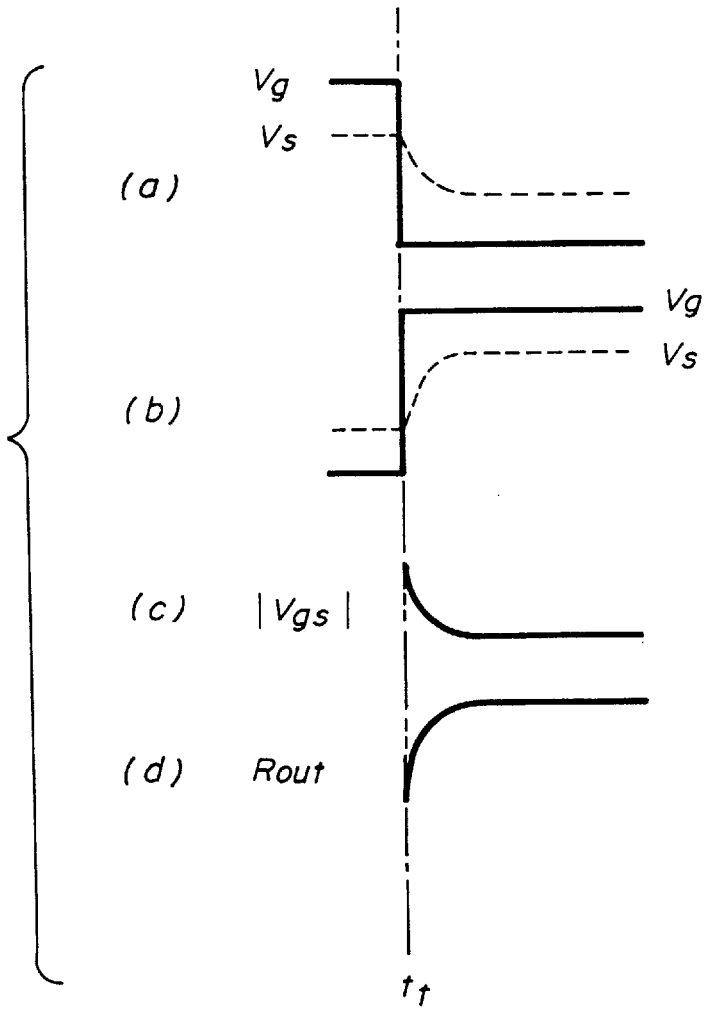
FIGS. 5(a), (b), (c) and (d) is a waveform diagram illustrating the level transition of the gate voltage $V_g$ and the source voltage $V_s$ in each of the p-type and n-type FETs shown in FIGS. 4A and 4B, a variation of the gate-source voltage $V_{gs}$ and the output resistance $R_{out}$ of the output buffer circuit.
Figure 6:
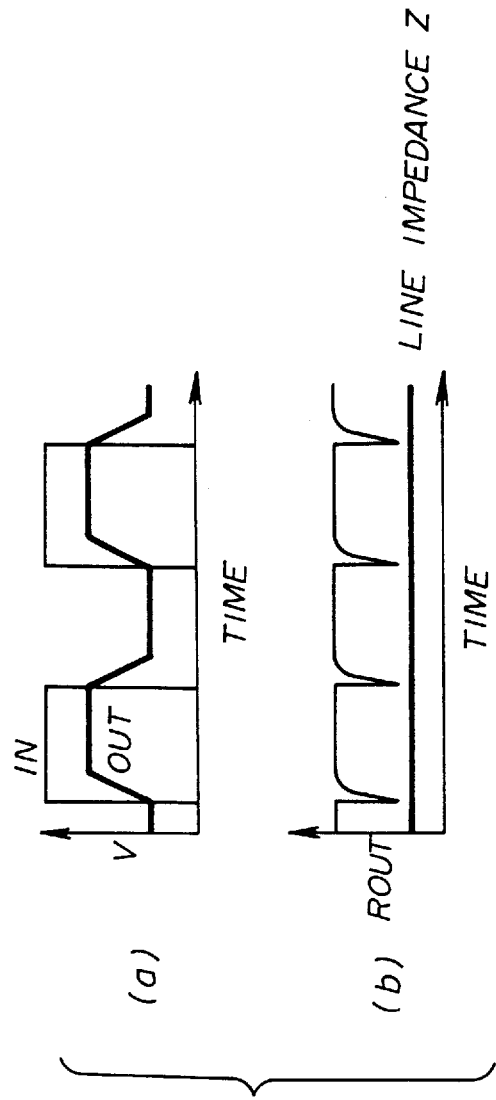
FIGS. 6(a) and (b) is diagram illustrating an input signal (IN), an output signal (OUT) and the output resistance $R_{out}$ in a case of the output buffer shown in FIG. 3.

In addition, in the source follower operation of the n-type FET shown in FIG. 4B (corresponding to the above first case), the gate voltage $V_g$ and the source voltage $V_s$ are varied, as shown in FIG. 5(b), in the level transition from the low level to the high level. Thus, also in this case, the absolute value of the gate-source voltage $V_{gs}$ is varied as shown in FIG. 5(c). As a result, the output resistance $R_{out}$ is varied as shown in FIG. 5(d).

In the output buffer circuit 2, the changes of the gate voltage $V_g$ and the source voltage $V_s$ of the p-type FET Q2 as shown in FIG. 5(a) respectively correspond to the changes of the input signal (IN) and the output signal (OUT) from the high level to the low level shown in FIG. 6(a). Furthermore, the changes of the gate voltage $V_g$ and the source voltage $V_s$ of the n-type FET Q1 as shown in FIG. 5(b) respectively correspond to the changes of the input signal (IN) and the output signal (OUT) from the low level to the high level. Thus, in a case where the output buffer circuit 2 has the relationship between the input signal (IN) and the output signal (OUT) as shown in FIG. 6(a), the output resistance $R_{out}$ is varied as shown in FIG. 6(b). That is, every time the input signal is changed from the high level to the low level or the low level to the high level, the output resistance $R_{out}$ is rapidly decreased so as to become close to the line impedance Z. After this, the output resistance $R_{out}$ is gradually increased to a constant value. Circuit constants, such as the constant value to which the output resistance $R_{out}$ is increased, of the output buffer circuit 2 are determined so that the levels of the output signal (OUT) satisfy the standard of the small-amplitude interface such as the CTT.

According to the above output buffer circuit 2, since the output resistance $R_{out}$ is lowered as shown in FIG. 6(b) every time the level of the output signal (OUT) is changed from the high level to the low level or from the low level to the high level, the impedance matching between the output resistance $R_{out}$ and the line impedance Z of the transmission line (the bus line 4) is improved in the level transition of the output signal (OUT). As a result, even if the level of the output signal is changed from the high level to the low level and vice versa at a high speed, the waveform distortion of the output signal in the level transition is small. Thus, the output signal in which the level transition from the high level to the low level and vice versa is performed at a high speed can be stably transmitted in the transmission line (the bus line 4).

Figure 7A:
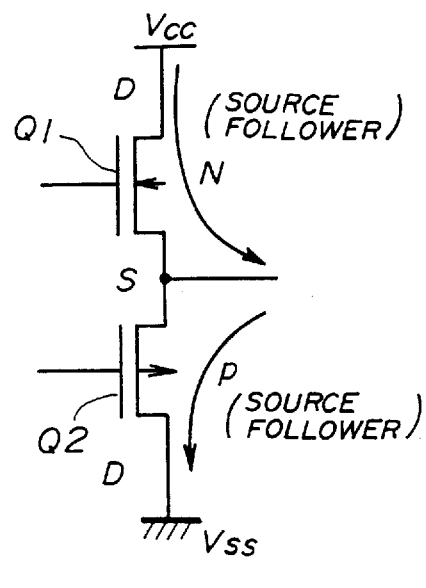
FIGS. 7A, 7B and 7C are circuit diagrams illustrating variations of an essential part of the output buffer circuit according to the embodiment of the present invention.
Figure 7B:
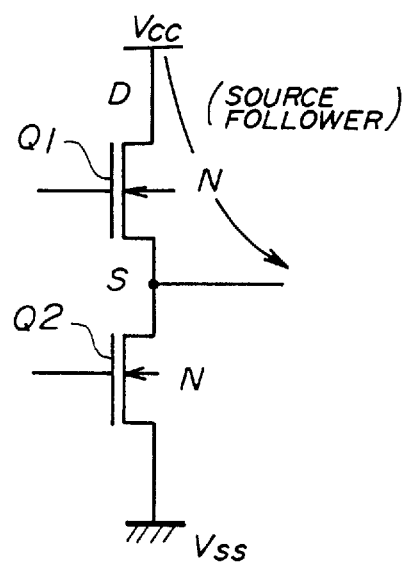
Figure 7C:
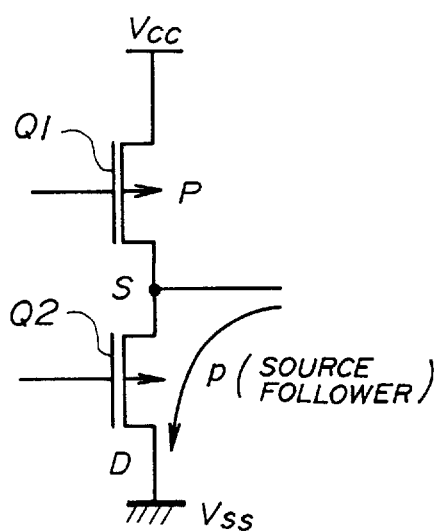

The structure including the n-type FET Q1 and the p-type FET Q2 is an essential part of the output buffer circuit 2. FIGS. 7A, 7B and 7C show variations of the essential part of the output buffer circuit 2.

In a variation shown in FIG. 7(a), the essential part is formed of the n-type FET Q1 and the p-type FET Q2 in the same manner as that shown in FIG. 3. In this variation, both the n-type FET Q1 and the p-type FET may carry out the source follower operation as has been described above.

In a variation shown in FIG. 7(b), the essential part is formed of two n-type FETs Q1 and Q2. In this variation, when the output signal has the H-level, the n-type FET Q1 connected to the power line $V_{cc}$ is in the ON state and carries out the source follower operation as described above.

In a variation shown in FIG. 7(c), the essential part is formed of two p-type FETs Q1 and Q2. In this variation, when the output signal has the L-level, the p-type FET Q2 is in the ON state and carries out the source follower operation as described above.

Figure 8:
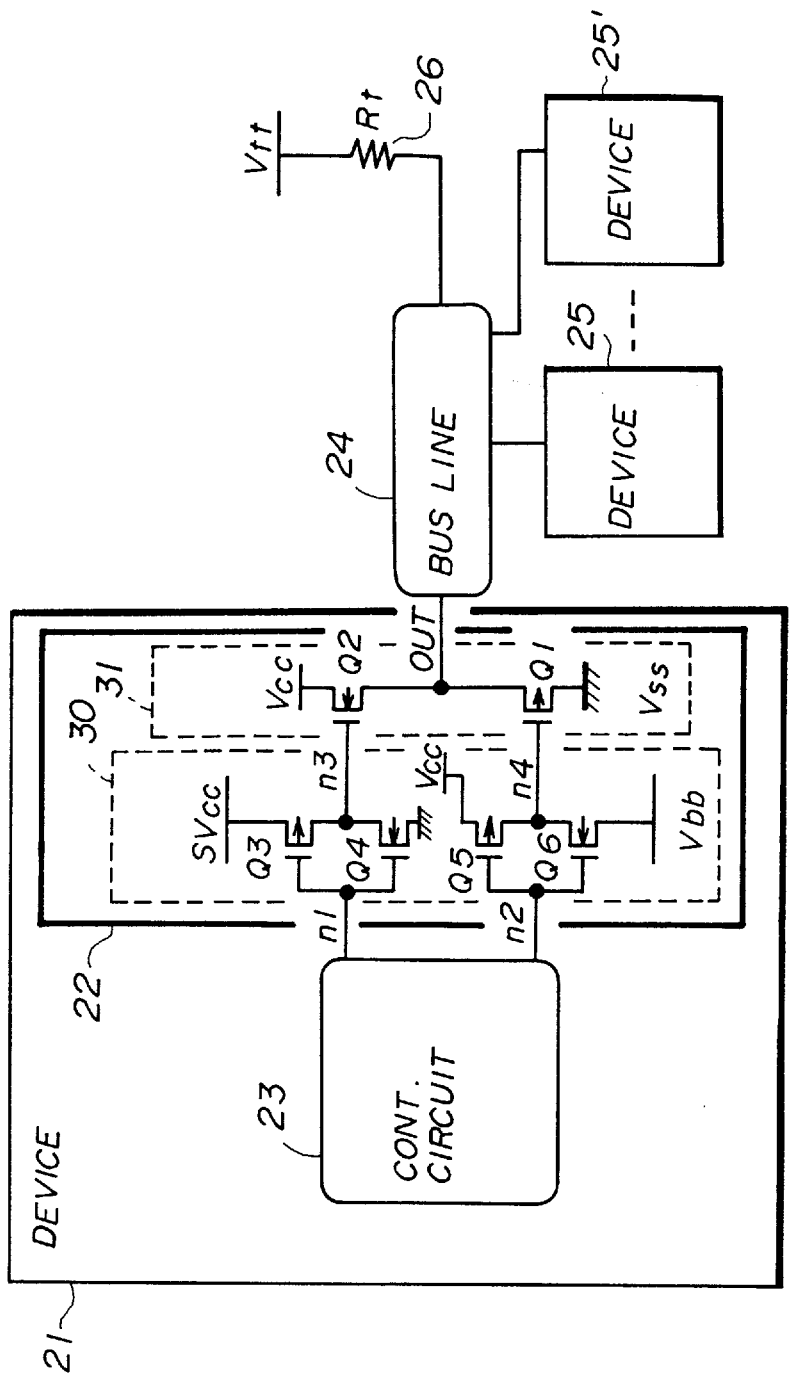
FIG. 8 is a circuit diagram illustrating a first embodiment of the present invention.

A description will now given, with respect to FIG. 8, of a first embodiment of the present invention.

Referring to FIG. 8, a device 21 includes an output buffer 22 and a control circuit 23. The output buffer 22 is formed of a driver circuit 30 and an output circuit 31. The output circuit 31 is formed of a p-type FET Q1 connected to the ground line $V_{ss}$ and an n-type FET Q2 connected to the power line $V_{cc}$. A node at which the sources (S) of both the p-type FET Q1 and the n-type FET Q2 are connected to each other is an output terminal (out) of the output buffer circuit 22.

The driver circuit 30 has a first driver unit formed of a p-type FET Q3 and an n-type FET Q4. The sources (S) of the p-type FET Q3 is connected to the power line $SV_{cc}$. An output voltage of the power line $SV_{cc}$ is greater than that of the power line $V_{cc}$. The source of the n-type FET Q4 is connected to the ground line. The gates (G) of both of the p-type FET Q3 and the n-type FET Q4 are connected to each other, and the drains (D) of both the p-type FET Q3 and the n-type FET Q4 are connected to each other. A first control signal (n1) is supplied from the control circuit 23 to a node at which the gates (G) of both the FETs Q3 and Q4 are connected to each other. A first driving signal (n3) is supplied to the gate of the p-type FET Q2 of the output circuit 31 from a node at which the drains of both the FETs Q3 and Q4 are connected.

The driver circuit 30 has also a second driver unit formed of a p-type FET Q5 and an n-type FET Q6. The source (S) of the p-type FET Q5 is connected to the power line $V_{cc}$. The source (S) of the n-type FET Q6 is connected to the power line $V_{bb}$. The power line $V_{bb}$ has a voltage less than that of the ground line $V_{ss}$. The gates (G) of both the p-type FET Q5 and the n-type FET Q6 are connected to each other, and the drains (D) of both the p-type FET Q5 and the n-type FET Q6 are connected to each other. A second control signal (n2) is supplied from the control circuit 23 to a node at which the gates (G) of both the FETs Q5 and Q6 are connected to each other. A second driving signal (n4) is supplied to the gate (G) of the p-type FET Q1 of the output circuit 31 from a node at which the drains (D) of both the FETs Q5 and Q6 are connected.

The output (out) of the output buffer circuit 22 is connected to a bus line 24 terminated by a terminating resistor $R_t$ 26 connected to the power line $V_{tt}$. The voltage of the $V_{tt}$ is approximately half of the voltage of the power line $V_{cc}$ ($V_{tt}=\frac{1}{2}V_{cc}$). Other devices 25 . . . , and 25' are connected to the bus line 24.

When the first control signal (n1) and the second control signal (n2) have the L-level, the p-type FET Q3 of the first driver unit is in the ON state. In this case, the first driving signal (n3) has a level equal to the voltage ($SV_{cc}$) of the power line $SV_{cc}$. That is, the voltage ($SV_{cc}$) of the power line $SV_{cc}$ is applied to the gate (G) of the n-type FET Q2, so that the n-type FET Q2 is in the ON state.

In addition, since the second control signal (n2) has the L-level, the p-type FET Q5 of the second driver unit is in the ON state. As a result, the voltage of the power line $V_{cc}$ is applied to the gate (G) of the p-type FET Q1 so that the p-type FET Q1 is in the OFF state.

Thus, in the output circuit 31, the n-type FET Q2 carries out the source follower operation, so that the output buffer circuit 22 outputs the H-level signal to the bus line 24.

When the first control signal (n1) and the second control signal (n2) have the H-level, the n-type FET Q4 of the first driver unit is in the ON state. In this case, the first driving signal (n3) has a level equal to the voltage of the ground line ($V_{ss}$). That is, the ground level is applied to the gate of the n-type FET Q2, so that the n-type FET Q2 is in the OFF state.

In addition, since the second control signal (n2) has the H-level, the n-type FET Q6 of the second driver unit is in the ON state. In this case, the second driving signal (n4) has a level equal to the level ($V_{bb}$) of the power line $V_{bb}$. That is, the voltage ($V_{bb}$) of the power line $V_{bb}$ is applied to the gate (G) of the p-type FET Q1, so that the p-type FET Q1 is in the ON state.

Thus, in the output circuit 31, the p-type FET Q1 carries out the source follower operation, so that the output buffer circuit 22 outputs the L-level signal to the bus line.

According to the above output buffer circuit 22, the n-type FET Q2 carries out the source follower operation in the level transition from the low level to the high level of the output signal and the p-type FET Q1 carries out the source follower operation in the level transition from the high level to the low level of the output signal. Thus, the output resistance $R_{out}$ of the output buffer circuit 22 is lowered every time the level transition of the output signal is performed. As a result, the waveform distortion of the output signal in the level transition is small.

In addition, to make the n-type FET Q2 be in the ON state, the n-type FET Q2 is driven by the voltage of the power line $SV_{cc}$ which is greater than the voltage of the power line $V_{cc}$. The drivability of the n-type FET Q2 driven by the voltage of the power line $SV_{cc}$ is superior to the drivability of n-type FET Q2 driven by the voltage of the power line $V_{cc}$. As a result, in this case, the n-type FET Q2 can be miniaturized. Furthermore, to make the p-type FET Q1 be in the ON state, the p-type FET Q1 is driven by the voltage of the power line $V_{bb}$ which is less than the ground level ($V_{ss}$). The drivability of the p-type FET Q1 driven by the voltage of the power line $V_{bb}$ is superior to the drivability of the p-type FET Q1 driven by the ground level ($V_{ss}$). As a result, in this case, the p-type FET Q1 can be miniaturized.

Figure 9:
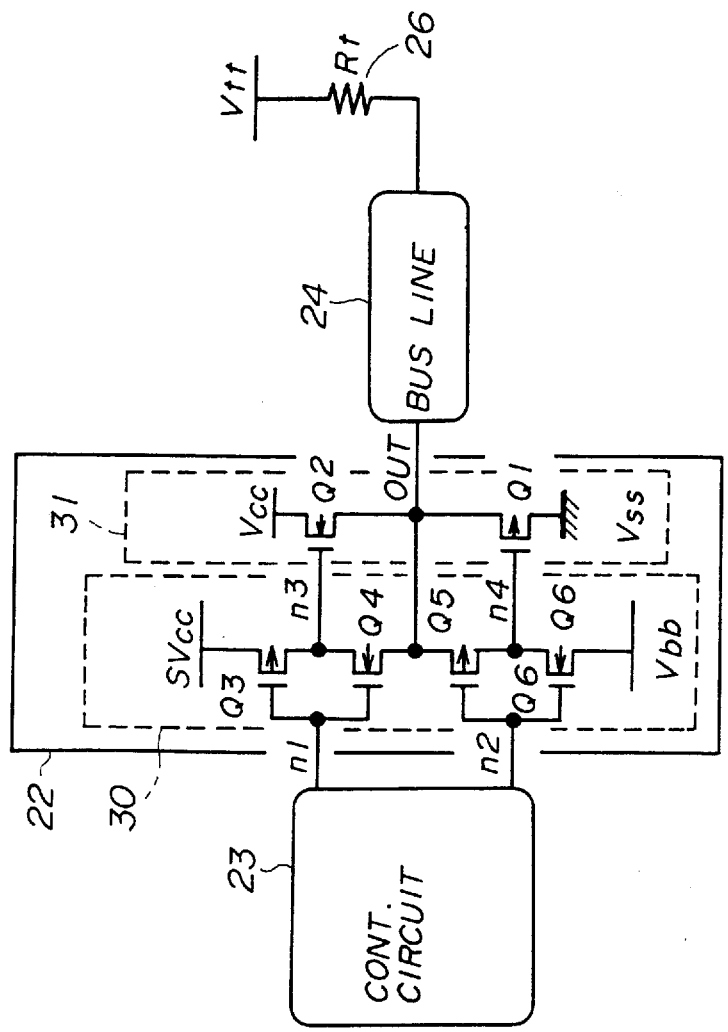
FIG. 9 is a circuit diagram illustrating a second embodiment of the present invention.

A description will now be given, with reference to FIG. 9, of a second embodiment of the present invention. In FIG. 9, those parts which are the same as those shown in FIG. 8 are given the same reference numbers.

Referring to FIG. 9, the source (S) of the n-type FET Q4 of the first driver unit is connected to the source (S) of the p-type FET Q5. Further, a node at which the sources (S) of the n-type FET Q4 and the p-type FET Q5 is connected to the output terminal (out) of the output buffer circuit 22.

In the output buffer circuit 22, when the first control signal (n1) has the L-level and the second control signal (n2) has the L-level, the p-type FET Q3 and the n-type FET Q2 are in the ON state and the n-type FET Q4 is in the OFF state. In addition, since the second control signal (n2) has the L-level, the p-type FET Q5 is in the ON state and the n-type FET Q6 is in the OFF state. In this case, the H-level signal (the second driving signal) is supplied to the gate (G) of the p-type FET Q1, so that the p-type FET Q1 is in the OFF state. Thus, the H-level signal is output from the output terminal (out) to the bus line 24.

When the first control signal (n1) has the H-level and the second control signal (n2) has the H-level, the p-type FET Q3 is in the OFF state. In addition, in this case, the p-type FET Q5 is in the OFF state and the n-type FET Q6 is in the ON state. Thus, the voltage of the power line $V_{bb}$ is applied to the gate (G) of the p-type FET Q1, so that the p-type FET Q1 is in the ON state. As a result, the L-level signal is output from the output terminal (out) to the bus line 24.

In the second embodiment, when the H-level signal is output from the output buffer circuit 22, the voltage of the power line $SV_{cc}$ is applied to the gate (G) of the n-type FET Q2. In addition, when the L-level signal is output from the output buffer circuit 22, a voltage ($V_{ol}$) of the L-level signal is applied to the gate (G) of the n-type FET Q2 via the n-type FET Q4 which is in the ON state.

On the other hand, in the first embodiment, although the voltage of the power line $SV_{cc}$ is applied to the gate (G) of the n-type FET Q2 when the H-level signal is output, the voltage of the ground line ($V_{ss}$) is applied to the gate (G) of the n-type FET Q2 when the L-level signal is output. Thus, the difference between the highest voltage and the lowest voltage which are applied to the gate (G) of the n-type FET Q2 in the second embodiment is less than the difference in the first embodiment.

The difference between the highest voltage and the lowest voltage which are applied to the gate (G) of the p-type FET Q1 in the second embodiment is less than the difference in the first embodiment in the same manner as in the case of the n-type FET Q2.

Thus, according to the second embodiment, the amplitude of the signals supplied to the gate (G) of each of the FETs Q1 and Q2 can be decreased, so that the amount of dissipation power from the power lines $SV_{cc}$ and $V_{bb}$ can be decreased.

Figure 10:
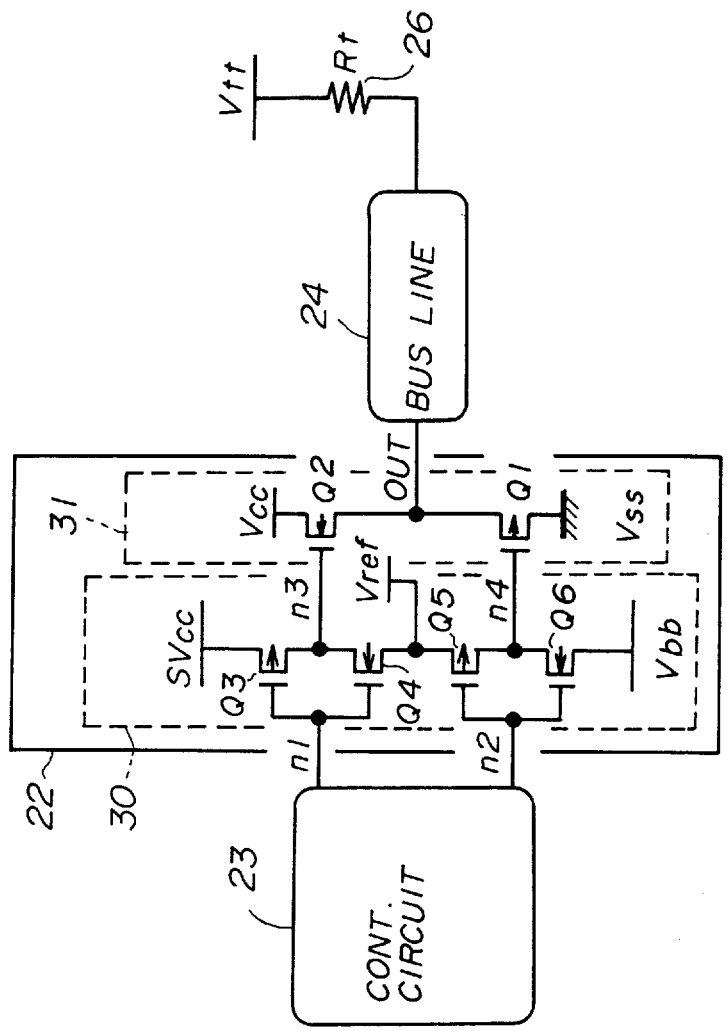
FIG. 10 is a circuit diagram illustrating a third embodiment of the present invention.

A description will now be given, with reference to FIG. 10, of a third embodiment of the present invention. In FIG. 10, those parts which are the same as those show in FIG. 8 are given the same reference numbers.

In the small-amplitude interface, a reference voltage $V_{ref}$ is used as a reference to determine whether a signal has the H-level or the L-level. Referring to FIG. 10, the reference voltage $V_{ref}$ is applied to the node at which the sources (S) of the n-type FET Q4 and the p-type FET Q5 are connected to each other.

In the third embodiment, when both the first and second control signals (n1 and n2) have the L-level, the n-type FET Q2 is in the ON state and the n-type FET Q5 is in the ON state. Thus, the reference voltage $V_{ref}$ is applied to the gate (G) of the p-type FET Q1 via the n-type FET Q5. In this case, the H-level ($V_{oh}$) of the output signal is applied to the source (S) of the p-type FET Q1, so that the gate-source voltage $V_{gs}$ of the p-type FET Q1 is equal to a voltage ($V_{ref} - V_{oh}$). Thus, if the p-type FET Q1 is designed so as to be in the OFF state under a condition in which the gate-source voltage $V_{gs}$ is equal to the voltage ($V_{ref} - V_{oh}$), the H-level signal is output from the output buffer circuit 22 when the first and second control signals (n1 and n2) have the L-level.

When both the first and second control signals (n1 and n2) have the H-level, the n-type FET Q4 is in the ON state, so that the reference voltage $V_{ref}$ is applied to the gate (G) of the n-type FET Q2 via the n-type FET Q4. In addition, the n-type FET Q6 is in the ON state, so that the p-type FET Q1 is in the ON state. In this case, the L-level ($V_{ol}$) of the output signal is applied to the source (S) of the n-type FET Q2, so that the gate-source voltage of the n-type FET Q2 is equal to a voltage ($V_{ref}$–$V_{ol}$). Thus, if the n-type FET Q2 is designed so as to be in the OFF state under a condition in which the gate-source voltage $V_{gs}$ is equal to the voltage ($V_{ref}$–$V_{ol}$), the L-level signal is output from the output buffer circuit 22 when the first and second control signal has the H-level.

A description will now be given, with reference to FIG. 11, of a fourth embodiment of the present invention. An output buffer circuit according to the fourth embodiment outputs a signal having a small amplitude standardized in the small-amplitude interface such as the CTT, and can further drive TTL circuits.

Figure 11:
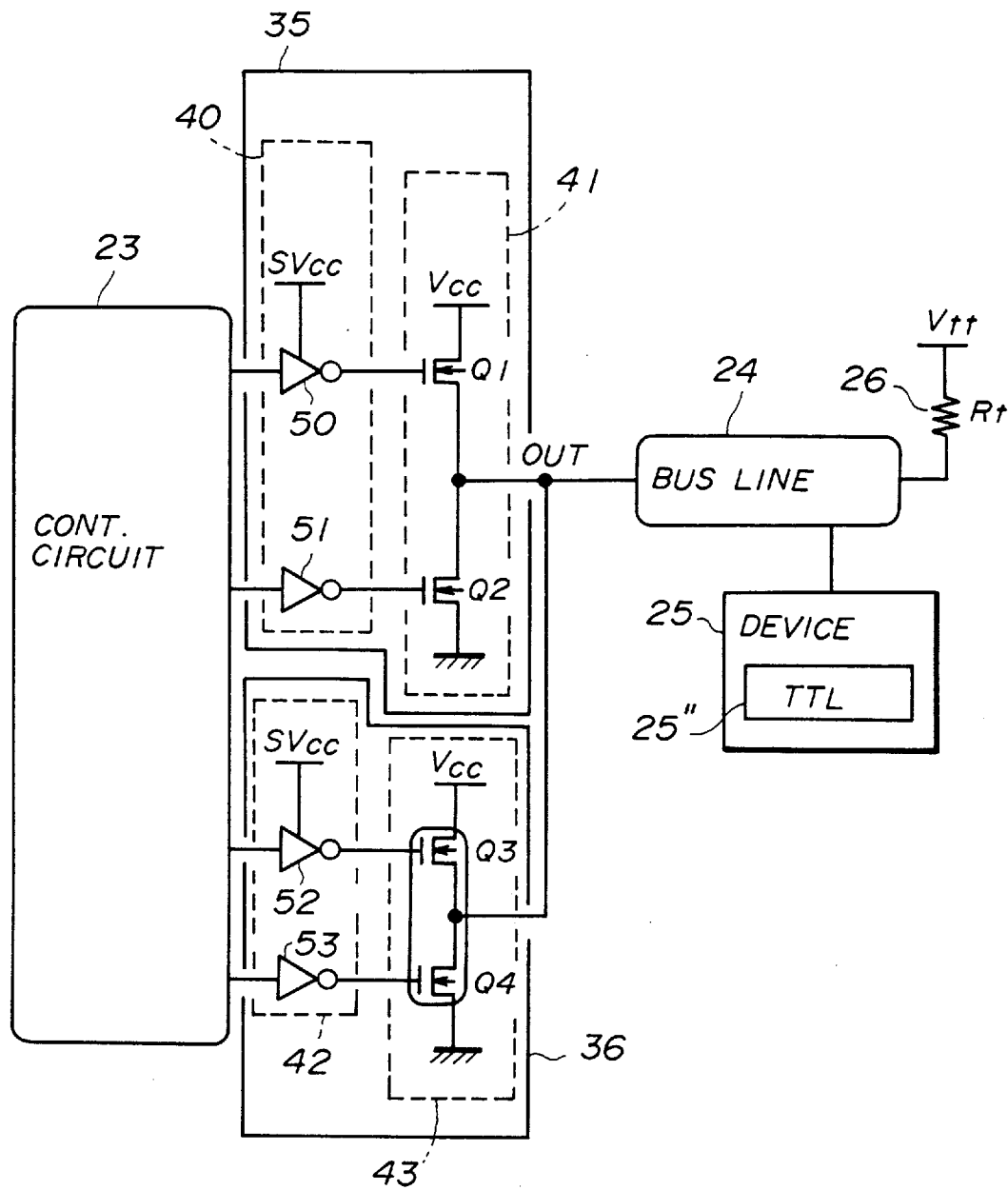
FIG. 11 is a circuit diagram illustrating a fourth embodiment of the present invention.

Referring to FIG. 11, a first output buffer circuit 35 and a second output buffer circuit 36 are connected to the control circuit 23. The first output buffer circuit 35 has a first driver circuit 40 and a first output circuit 41. The second output buffer circuit 36 has a second driver circuit 42 and a second output circuit 43. The first output buffer circuit 35 is used to output a signal having a small amplitude standardized in the small-amplitude interface such as the CTT. To drive TTL circuits, the first output buffer circuit 35 is used and the second output buffer circuit 36 is additionally used.

In the first output buffer circuit 35, the first output circuit 41 has n-type FETs Q1 and Q2 serially connected to each other between the power line $V_{cc}$ and the ground line. In the first output circuit 41, the n-type FET Q1 carries out the source follower operation in the same manner as in the case shown in FIG. 7B. A node at which the n-type FETs Q1 and Q2 are connected is an output terminal of the first output buffer circuit 35. The first driver circuit 40 has inverters 50 and 51. The voltage from the power line $SV_{cc}$ is supplied to the inverter 50. A first control signal from the control circuit 23 is supplied, through the inverter 50, to the gate (G) of the n-type FET Q1 of the first output circuit 41. A second control signal from the control circuit 23 is supplied, through the inverter 51, to the gate (G) of the n-type FET Q2 of the first output circuit 41.

In the second output buffer circuit 36, the second output circuit 43 has n-type FETs Q3 and Q4 which are serially connected to each other between the power line $V_{cc}$ and the ground line. A node at which the n-type FETs Q3 and Q4 are connected is an output terminal of the second output circuit 43. The second driver circuit 42 has inverters 52 and 53. The inverter 52 is provided with the voltage from the power line $SV_{cc}$. A third control signal from the control circuit 23 is supplied, through the inverter 52, to the gate (G) of the n-type FET Q3 of the second output circuit 43. A fourth control signal from the control circuit 23 is suppled, through the inverter 53, to the gate (G) of the n-type FET Q4 of the second output circuit 43.

The output terminals of the first and second output circuits 41 and 43 of the first and second output buffer circuits 35 and 36 are connected to the bus line 24 terminated by the terminating resistor $R_t$ 26 connected to the power line $V_{tt}$. The device 25 is connected to the bus line 24. The device 25 includes a TTL circuit 25'.

In the fourth embodiment, the n-type FETs Q1 and Q2 are controlled by using the first and second control signals under a condition in which the n-type FETs Q3 and Q4 are turned off by using the third and fourth control signals so that signals having small amplitudes are output from the first output buffer 35. To compensate for lack of the drivability of the n-type FETs Q1 and Q2 for driving the TTL circuit 25', the n-type FETs Q3 and Q4 are additionally driven by using the third and fourth control signals. That is, the first and second output buffer circuits 35 and 36 are operated in parallel so that a TTL output for driving the TTL circuit 25' is obtained.

The second output circuit 43 may be formed of CMOS-FETs in place of the n-type FETs Q3 and Q4.

Figure 12A:
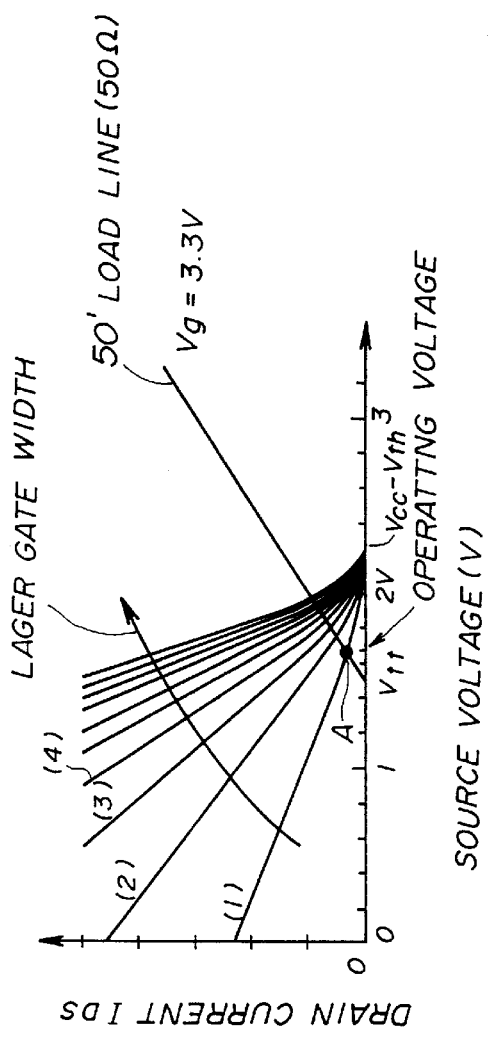
FIGS. 12A and 12B are diagrams illustrating operation analysis results of a FET used in the output buffer circuit according to the embodiment of the present invention.
Figure 12B:
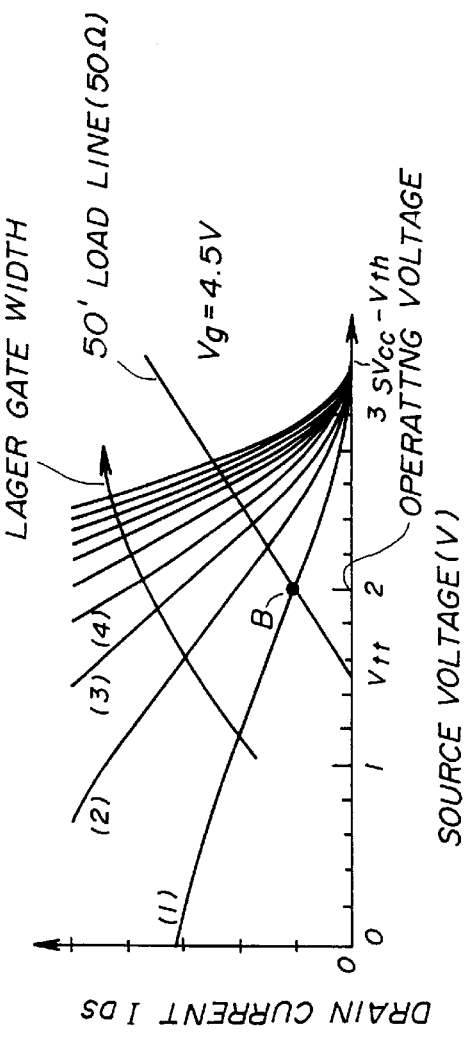

FIGS. 12A and 12B show operation analysis results of an FET used in the output buffer circuit. In FIGS. 12A and 12B, the axis of abscissas indicates the source voltage and the axis of ordinates indicates the drain current $I_{DS}$. Each characteristic curve depends on a parameter of the gate width. In accordance with an order in which the characteristic curves (1), (2), (3), (4) . . . are arranged, the corresponding gate width increases. A load line 50' corresponds to a load having 50Ω. The threshold of the FET is indicated by $V_{th}$ and the terminating voltage is indicated by $V_{tt}$.

FIG. 12A indicates operation analysis results in a case where the gate voltage $V_g$ is equal to 3.3 volts ($V_g$=3.3 V). In FIG. 12A, an intersecting point at which each characteristic curve intersects the load line 50' indicates an operating point identified by a drain current and an output voltage of the FET which is in the ON state. For example, in a case of the characteristic curve (1), a current and a voltage at a point A respectively indicate an output voltage and a drain current in a case where a load of 50Ω is connected to the FET having a gate width corresponding to the characteristic curve (1). As indicated in FIG. 12A, in the case where $V_g$ is equal to 3.3 volts ($V_g$=3.3 V), even if the gate width is increased, a sufficient drain current is not obtained.

FIG. 12B indicates operation analysis results in a case where the gate voltage $V_g$ is equal to 4.5 volts ($V_g$=4.5 V). In FIG. 12B, an intersecting point B at which the characteristic curve (1) intersects the load line 50' is an operating point in a case where a load of 50Ω is connected to the FET having the gate width corresponding to the characteristic curve (1). In this case where the gate voltage $V_g$ is equal to 4.5 volts, as indicated in FIG. 12B, sufficient drain current and output voltage can be obtained.

Based on the experimental operation analysis results, it is preferable that the n-type FET is provided with the gate voltage $V_g$ equal to ($V_{cc}$+ 2$V_{th}$), where $V_{cc}$ is a voltage of the power line connected to the n-type FET and $V_{th}$ is a positive value ($V_{th}$>0). In addition, it is preferable that the p-type FET is provided with the gate voltage $V_g$ equal to ($V_{cc}$+2$V_{th}$), where $V_{cc}$ is a voltage of the power line connected to the p-type FET and $V_{th}$ is a negative value ($V_{th}$<0).

The present invention is not limited to the aforementioned embodiments, and variations and modifications may be made without departing from the scope of the claimed invention.

What is claimed is:

1. An output buffer circuit, comprising:
   a portion for receiving an input signal in which a level thereof is changed from a high level to a low level and vice-versa; and
   a circuit block coupled to said portion, for operating based upon the input signal received by said portion and for outputting an output signal in which a level thereof is changed from a high level to a low level and vice-versa in response to level transition of the input signal, said circuit block including
   a circuit arrangement of a plurality of FET's for temporarily lowering an output resistance of said circuit block in level transition of the output signal, said plurality of FET's including a first FET and a second FET which are serially connected to each other between a first line having a first voltage and a second line having a second voltage lower than the first voltage, gate voltages of said first FET and said second FET being controlled based upon said input signal, the output signal being output from a node at which said first FET and said FET are connected to each other, wherein said first FET is an N-type FET having a drain connected to said first line, and said second FET is P-type FET having a drain connected to said second line, sources of said N-type FET and said P-type FET being connected to each other, said circuit block further comprising a first driver circuit for supplying to a gate of said first FET a first driving signal in which a level thereof is changed from a high level higher than the first voltage of said first line to a low level and vice versa in response to the level transition of the input signal; and a second driver circuit for supplying to a gate of said second FET a second driving signal in which a level thereof is changed from a high level to a low level lower than the second voltage of said second line and vice versa in response to the level transition of the input signal.

2. The output buffer circuit as claimed in claim 1, wherein said first driver circuit supplies to the gate of said first FET, as the low level of the first driving signal, a voltage equal to the second voltage of said second line.

3. The output buffer circuit as claimed in claim 1, wherein said second driver circuit supplies to the gate of the second FET, as the high level of the second driving signal, a voltage equal to the first voltage of said first line.

4. The output buffer circuit as claimed in claim 1, wherein said first driver circuit has a circuit for feeding back, as the low level of the first driving signal, the low level of the output signal to the gate of said first FET.

5. The output buffer circuit as claimed in claim 1, wherein said second driver circuit has a circuit for feeding back, as the high level of the second driving signal, the low level of the output signal to the gate of said second FET.

6. The output buffer circuit as claimed in claim 1, wherein said first driver circuit has a circuit for supplying to the gate of said first FET, as the low level of the first driving signal, a voltage equal to a reference voltage used to determine whether a signal has a high level or a low level.

7. The output buffer circuit as claimed in claim 1, wherein said second driver circuit has a circuit for supplying to the gate of said second FET, as the high level of the second driving signal, a voltage equal to a reference voltage used to determine whether a signal has a high level or a low level.

* * * * *